(12) United States Patent
Gunasekaran et al.

(10) Patent No.: US 12,244,319 B2
(45) Date of Patent: Mar. 4, 2025

(54) CHARGE PUMP SPUR CORRECTION

(71) Applicant: TEXAS INSTRUMENTS INCORPORATED, Dallas, TX (US)

(72) Inventors: Karthikeyan Gunasekaran, Bangalore (IN); Jagannathan Venkataraman, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/977,834

(22) Filed: Oct. 31, 2022

(65) Prior Publication Data

US 2024/0146314 A1    May 2, 2024

(51) Int. Cl.
*H03L 7/089* (2006.01)
*H03L 7/099* (2006.01)

(52) U.S. Cl.
CPC .......... *H03L 7/0895* (2013.01); *H03L 7/0992* (2013.01)

(58) Field of Classification Search
CPC ... H03L 7/08; H03L 7/081; H03L 7/14; H03L 7/143; H03L 7/145; H03L 7/146
See application file for complete search history.

(56) References Cited

U.S. PATENT DOCUMENTS

| | | | | |
|---|---|---|---|---|
| 9,300,307 B2* | 3/2016 | Juneau | ............... | H03C 3/0925 |
| 10,873,333 B2* | 12/2020 | Avivi | ............... | H03L 7/093 |
| 11,082,054 B1* | 8/2021 | Cascio | ............... | H03M 1/0697 |
| 2005/0242860 A1* | 11/2005 | Yun | ............... | H04N 9/3129 |
| | | | | 327/210 |

* cited by examiner

*Primary Examiner* — Diana J. Cheng
(74) *Attorney, Agent, or Firm* — John R. Pessetto; Frank D. Cimino

(57) ABSTRACT

In an example, a system includes a phase frequency detector (PFD) coupled to a charge pump, and a loop filter coupled to the charge pump. The system also includes a voltage controlled oscillator (VCO) coupled to the loop filter. The system includes a fast Fourier transform (FFT) engine coupled to an output of the VCO, the FFT engine configured to estimate a phase and a magnitude of reference spurs of an input reference signal. The system includes spur correction circuitry coupled to an input of the VCO, the spur correction circuitry configured to correct for the reference spurs of the input reference signal based at least in part on the phase and magnitude of the reference spurs.

21 Claims, 9 Drawing Sheets

US 12,244,319 B2

CHARGE PUMP SPUR CORRECTION

BACKGROUND

Generally, a phase-lock loop (PLL) is a feedback control circuit that automatically adjusts the phase of a locally generated signal to match the phase of an input signal. In some systems a PLL compares the frequency of a local oscillator to that of a received input signal and uses a feedback loop to lock the local oscillator's frequency to that of the received input signal. The output frequency of the local oscillator may be a multiple of the input frequency. A PLL may include a phase frequency detector (PFD), charge pump, loop filter, and voltage controlled oscillator (VCO).

SUMMARY

In accordance with at least one example of the disclosure, a system includes a phase frequency detector (PFD) coupled to a charge pump, and a loop filter coupled to the charge pump. The system also includes a voltage controlled oscillator (VCO) coupled to the loop filter. The system includes a fast Fourier transform (FFT) engine coupled to an output of the VCO, the FFT engine configured to estimate a phase and a magnitude of reference spurs of an input reference signal. The system includes spur correction circuitry coupled to an input of the VCO, the spur correction circuitry configured to correct for the reference spurs of the input reference signal based at least in part on the phase and magnitude of the reference spurs.

In accordance with at least one example of the disclosure, a method includes operating a phase-locked loop (PLL) in an open-loop configuration. The method includes estimating a signal response during open-loop configuration for reference spur correction circuitry. The method also includes operating the PLL in a closed-loop configuration. The method includes estimating a phase and magnitude of one or more reference spurs of an input reference signal during closed-loop configuration. The method also includes providing a correction signal from the reference spur correction circuitry to correct one or more reference spurs, where the correction signal is based at least in part on the phase and magnitude of the one or more reference spurs.

In accordance with at least one example of the disclosure, a system includes a PLL. The PLL includes a PFD coupled to a charge pump, the PFD configured to receive an input reference signal. The PLL includes a loop filter coupled to the charge pump. The PLL also includes a VCO coupled to the loop filter. The system includes an FFT engine configured to estimate a phase and a magnitude of reference spurs of the input reference signal. The FFT engine is also configured to estimate a signal response for reference spur correction circuitry, where the reference spur correction circuitry is configured to provide a correction signal to correct for the reference spurs of the input reference signal based at least in part on the phase and magnitude of the reference spurs and the signal response of the reference spur correction circuitry.

BRIEF DESCRIPTION OF THE DRAWINGS

The same reference numbers or other reference designators are used in the drawings to designate the same or similar (functionally and/or structurally) features.

DETAILED DESCRIPTION

Figure 1A:
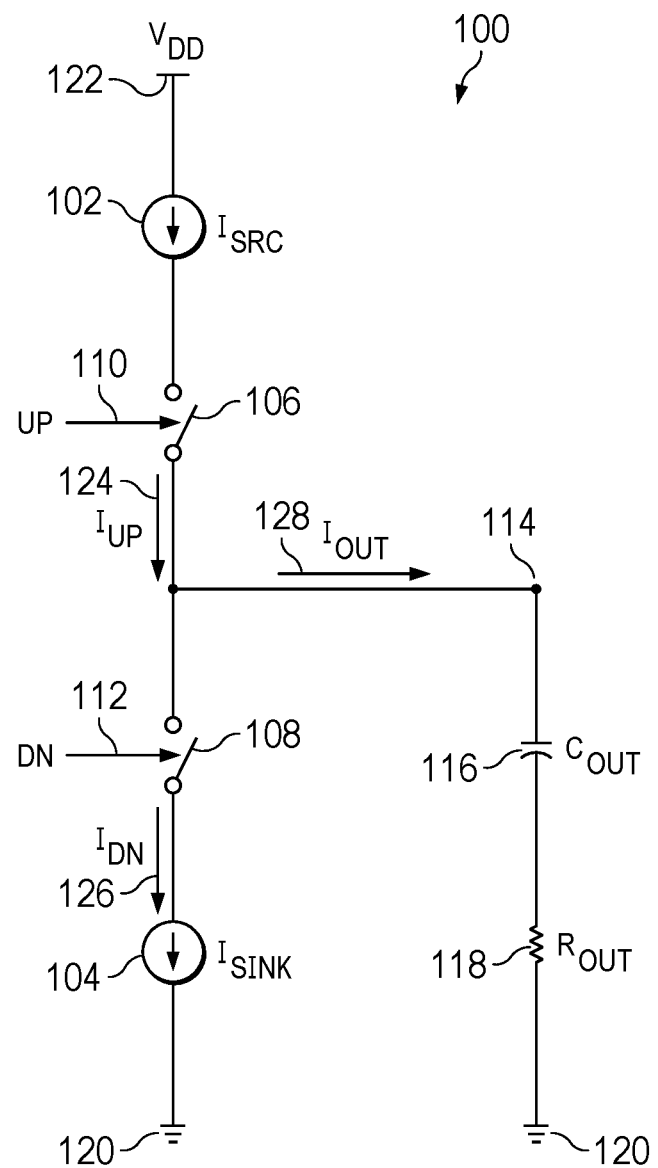
FIG. 1A is a circuit diagram of a charge pump in accordance with various examples.

In some examples, a PLL receives a reference signal $V_{REF}$ having a relatively stable frequency ($F_{REF}$) at an input and produces an output signal ($V_{OUT}$) with a frequency ($F_{OUT}$) that is a multiple of the reference signal at an output. The PLL also locks the phase of the output signal with the input signal. A PLL may include a PFD followed by a charge pump. The PFD receives the reference signal $V_{REF}$ and a feedback signal at its two inputs, and determines which of the two inputs has a lower frequency or a lagging phase. The charge pump receives pulses from the output of the PFD and converts those pulses into a push or pull of current into or out of a capacitor. The charge pump generates the control voltage for the VCO, which controls the frequency of the VCO. A loop filter may reside between the charge pump and the VCO.

The charge pump includes two current sources, a top current source ($I_{SRC}$) and a bottom current source ($I_{SINK}$) that are selectable by switches. Signals from the PFD select the switches (such as, causing the switch to close to be conducting or to open to be non-conducting). Based on the state of the switches, current is pushed into or pulled out of the output capacitor in the charge pump. If the current sources are matched, no current flows when both switches are closed. If there is a mismatch in the current sources (due to process variations, device aging, temperature, etc.), current is pushed to or pulled from the capacitor. If the pulses from the output of the PFD are misaligned, current may be pushed to or pulled from the capacitor. These types of misalignment cause the resultant output current from the charge pump to have an unwanted $F_{REF}$ component (e.g., a spur). If one pulse from the PFD is longer than another pulse, the different time widths of these pulses may also cause the output current to have a spur. Spurs are undesired signals at fixed frequencies that may interfere with the proper operation of the PLL. Attempts to remove the spurs using filters may reduce phase margin and gain margin, and may increase the area required for the PLL. Increasing $F_{REF}$ to prevent spurs may require an oscillator (e.g., a crystal, a bulk acoustic wave device, etc.) that increases the cost of the circuit.

In examples herein, a correction block is implemented in the PLL to insert a signal that cancels unwanted spurs. The correction block includes phase-shifted $V_{REF}$ signals and a series of variable capacitors. A fast Fourier transform (FFT) engine estimates gain and phase mapping of the PLL by stepping through the values of the capacitances in the capacitor banks. The FFT engine determines the magnitude and phase for each capacitor value. Then, the FFT engine measures the spurs that occur at $F_{REF}$, $2F_{REF}$, $3F_{REF}$, .... From that spur measurement, the correction block produces a correction signal that helps to cancel $F_{REF}$, $2F_{REF}$, etc., by selecting the phase and the appropriate capacitors from the capacitor banks. The correction block produces a correction signal with a phase and magnitude that cancels the spurs at $F_{REF}$, $2F_{REF}$, etc. The correction signal is applied at the input of the VCO in one example. The FFT engine may also continuously monitor the signal in the PLL to provide estimation and correction of spurs. The examples herein reduce the magnitude of the spurs to meet performance metrics for wireless transmissions.

FIG. 1A is a circuit diagram of a charge pump in accordance with various examples herein. Charge pump 100 includes a top current source $I_{SRC}$ 102 and a bottom current source $I_{SINK}$ 104. Charge pump 100 also includes a switch 106 coupled to $I_{SRC}$ 102 and a switch 108 coupled to $I_{SINK}$ 104. Switch 106 is controlled by an UP signal 110, and switch 108 is controlled by a DN (down) signal 112. Switches 106 and 108 are coupled to node 114, which is an output node for charge pump 100 that may also be referred to as $V_{CONTROL}$ node. The signal at node 114 is provided to the loop filter and then to the VCO in one example. Charge pump 100 also includes an output capacitor $C_{OUT}$ 116 and an output resistor $R_{OUT}$ 118. Output resistor $R_{OUT}$ 118 and $I_{SINK}$ 104 are coupled to a common potential (e.g., ground) 120. $I_{SRC}$ 102 is coupled to a voltage supply 122 that produces a voltage $V_{DD}$. Charge pump 100 also includes currents $I_{UP}$ 124, $I_{DN}$ 126, and $I_{OUT}$ 128. $I_{UP}$ 124 is provided by $I_{SRC}$ 102 and $I_{DN}$ 126 is provided by $I_{SINK}$ 104. $I_{OUT}$ 128 is the output current provided to node 114.

The current sources $I_{SRC}$ 102 and $I_{SINK}$ 104 in charge pump 100 are selectable by switches 106 and 108, respectively. A PFD (not shown in FIG. 1A) compares a reference clock with a generated clock and produces the UP 110 and DN 112 signals. The UP 110 and DN 112 signals control switches 106 and 108 respectively. Based on the UP 110 and DN 112 signals, current is provided to or sunk from the output capacitor 116. If switch 106 is closed, $I_{UP}$ 124 is provided to node 114. If switch 108 is closed, $I_{DN}$ 126 is provided to node 114. The total current provided to node 114 is $I_{OUT}$ 128.

If charge pump 100 is in a lock state, switches 106 and 108 are both closed. The lock state is a steady state of operation for charge pump 100, and occurs if the phase and frequency of the input signals to the PFD are aligned. In the lock state, $I_{OUT}$ 128 should equal zero, because $I_{SRC}$ 102 and $I_{SINK}$ 104 are designed to be matched current sources, and therefore $I_{UP}$ 124 equals $I_{DN}$ 126. However, two types of mismatch may occur.

In the first type of mismatch, the UP 110 and DN 112 signals are misaligned (e.g., they are misaligned from a timing perspective such that one switch is activated/deactivated before the other switch), and a current is provided to capacitor $C_{OUT}$ 116 during the misalignment (e.g., $I_{OUT}$ 128 is non-zero). This misalignment may cause the signal at node 114 to have a voltage, which causes an unwanted $F_{REF}$ component in the output signal.

Figure 1C:
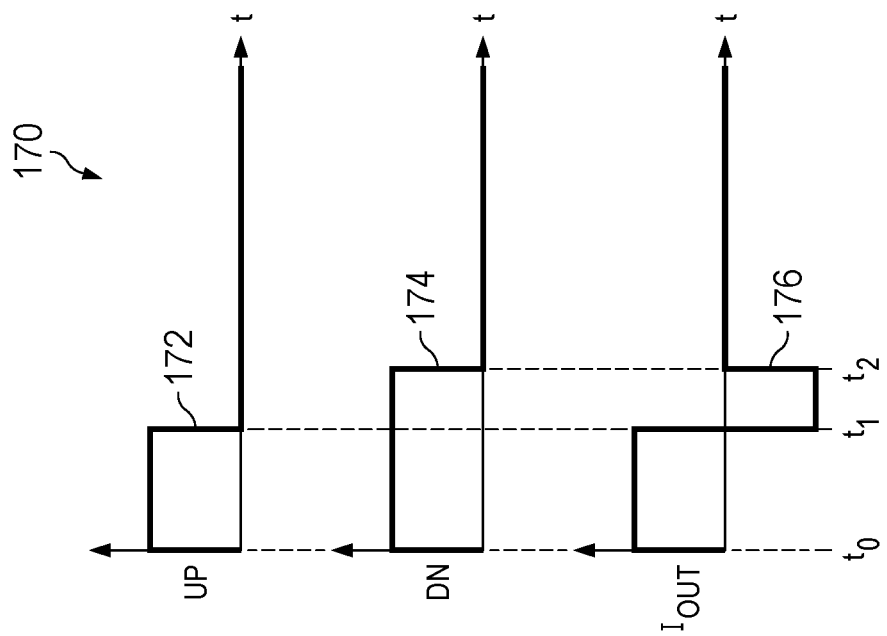
FIG. 1C is a timing diagram for a charge pump in accordance with various examples.
Figure 1B:
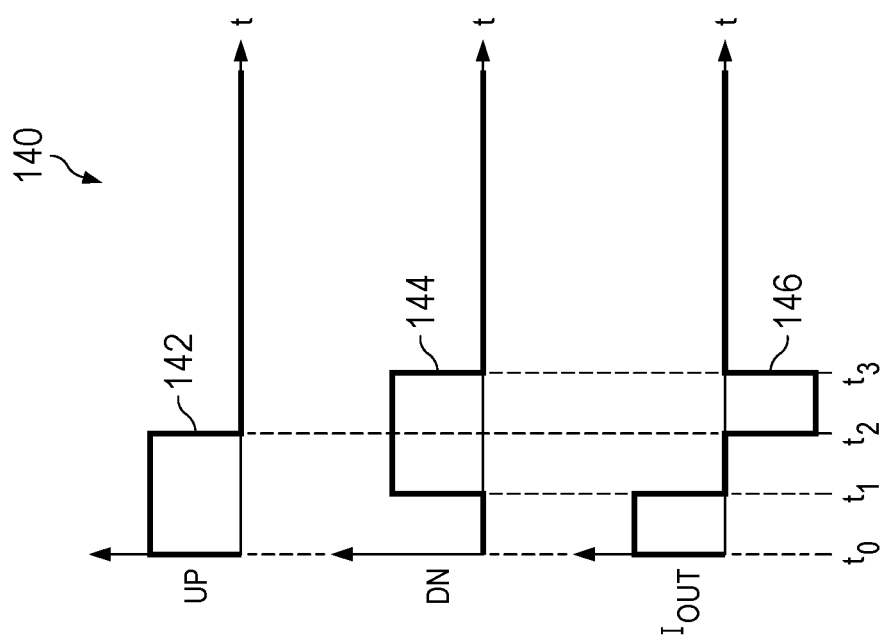
FIG. 1B is a timing diagram for a charge pump in accordance with various examples.

In the second type of mismatch, mismatch occurs between $I_{SRC}$ 102 and $I_{SINK}$ 104, and therefore $I_{UP}$ 124 does not equal $I_{DN}$ 126. If this mismatch occurs, current is sourced to or sunk from $C_{OUT}$ 116, and $I_{OUT}$ 128 has a non-zero value. One of the pulses (UP 110 or DN 112) may be made longer to compensate for the mismatch, to restore the average value of $I_{OUT}$ 128 to zero. However, these different time widths for the UP 110 and DN 112 signals may produce a frequency component in $I_{OUT}$ 128. A signal $V_{OSC}$ (which is supposed to have a frequency of $F_{OSC}$) output from the VCO may have spurs at $F_{OSC}-F_{REF}$ and $F_{OSC}+F_{REF}$, along with other spurs, in one example, caused by this frequency component in $I_{OUT}$ 128. FIGS. 1B and 1C are timing diagrams that show these two types of mismatch.

FIG. 1B is a timing diagram 140 of UP signal 110, DN signal 112, and $I_{OUT}$ 128. In timing diagram 140, UP signal 110 and DN signal 112 are misaligned, which is the first type of mismatch described above. Waveform 142 represents the UP signal 110, waveform 144 represents the DN signal 112, and waveform 146 represents $I_{OUT}$ 128. As shown in FIG. 1B, UP signal 110 (waveform 142) begins at time $t_0$ and ends at time $t_2$. DN signal 112 (waveform 144) begins at time $t_1$ and ends at time $t_3$. Because these signals are mismatched in time, $I_{OUT}$ 128 (waveform 146) has a positive value during $t_0$ to $t_1$, when UP signal 110 is high and DN signal 112 is low. During time $t_1$ to $t_2$, TOUT 128 is zero, because UP signal 110 and DN signal 112 are both high. During time $t_2$ to $t_3$, $I_{OUT}$ 128 has a negative value, because UP signal 110 is low and DN signal 112 is high. After time $t_3$, $I_{OUT}$ 128 is zero because both UP signal 110 and DN signal 112 are low. The non-zero values of $I_{OUT}$ 128 produce a voltage at node 114 in FIG. 1A, and this voltage may cause one or more unwanted $F_{REF}$ components (e.g., spurs) in the output signal.

FIG. 1C is a timing diagram 170 of UP signal 110, DN signal 112, and $I_{OUT}$ 128. In timing diagram 170, current sources $I_{SRC}$ 102 and $I_{SINK}$ 104 are mismatched, which is the second type of mismatch described above. In this example, $I_{SRC}$ 102 is stronger than $I_{SINK}$ 104 and therefore produces more current (e.g., $I_{UP}$ 124>$I_{DN}$ 126). This excess current from $I_{SRC}$ 102 provides $I_{OUT}$ 128 with a positive current value if both switches 106 and 108 are closed.

Waveform 172 represents the UP signal 110, waveform 174 represents the DN signal 112, and waveform 176 represents $I_{OUT}$ 128. As shown in FIG. 1C, UP signal 110 (waveform 172) begins at time $t_0$ and ends at time $t_1$. DN signal 112 (waveform 174) begins at time $t_0$ and ends at time $t_2$. Between time $t_0$ and $t_1$, both switches 106 and 108 are closed. Therefore, $I_{UP}$ 124 and $I_{DN}$ 126 are being provided to node 114, and combine to produce $I_{OUT}$ 128. However, because $I_{SRC}$ 102 is stronger than $I_{SINK}$ 104, $I_{OUT}$ 128 has a positive value between time $t_0$ and $t_1$.

The PLL may compensate for this excess current from $I_{SRC}$ 102 by extending the time that $I_{SINK}$ 104 provides current to node 114. This compensation is shown here, where DN signal 112 is extended to time $t_2$. Between times $t_1$ and $t_2$, $I_{SINK}$ 104 provides current to node 114 while $I_{SRC}$ 102 is disconnected via the opening of switch 106. $I_{OUT}$ 128 has a negative value between times $t_1$ and $t_2$. Because DN signal 112 is extended to time $t_2$, the average value of $I_{OUT}$ 128 from $t_0$ to $t_2$ is zero. The excess current provided by $I_{SINK}$ 104 between times $t_1$ and $t_2$ compensates for the excess current provided by $I_{SRC}$ 102 between times to and $t_1$. However, because of the different time widths of UP signal 110 and DN signal 112, the signal at node 114 has an $F_{REF}$ component. This $F_{REF}$ component may cause spurs in the PLL signal chain.

In examples herein, the mismatch and misalignment issues described above create a voltage at node 114 with a frequency component. A correction block produces an inverse of this voltage signal and applies the inverse signal (e.g., a correction signal) to cancel or suppress unwanted spurs. In an example, the correction signal may be applied at an input of the VCO. An FFT engine determines the frequencies of the spurs, and the correction block provides an appropriate correction signal based on those frequencies.

Figure 2A:
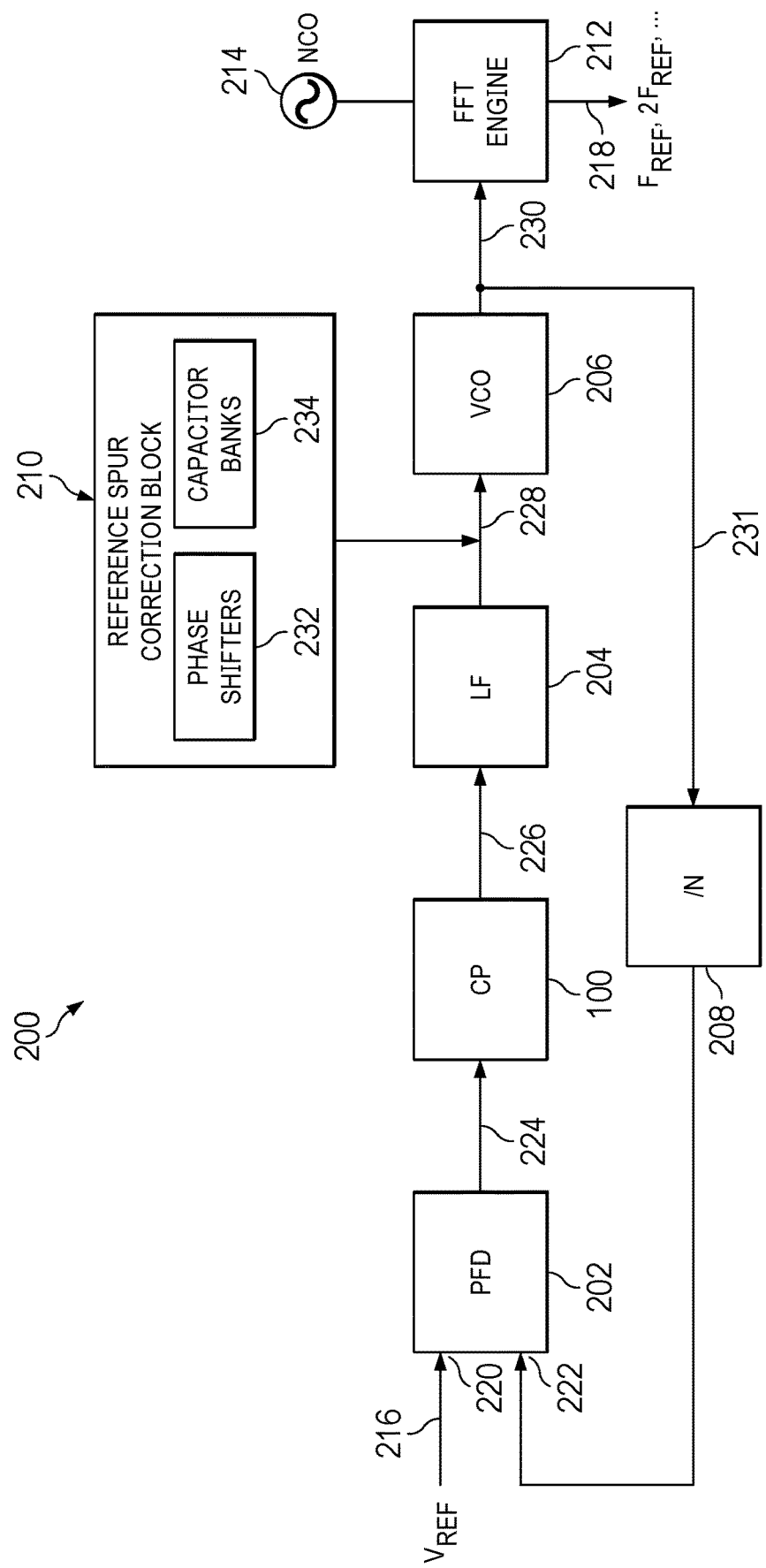
FIG. 2A is a block diagram of a system for reference spur correction in accordance with various examples.

FIG. 2A is a block diagram of a system 200 for reference spur correction in accordance with various examples herein. System 200 includes components of a PLL. System 200 includes a PFD 202, charge pump 100, loop filter 204, VCO 206, divider 208 (e.g., frequency divider), reference spur correction block 210, FFT engine 212, and numerically-controlled oscillator (NCO) 214. System 200 also includes an input reference signal $V_{REF}$ 216 (having a frequency of $F_{REF}$) provided to a first input of PFD 202. System 200 includes an output 218 of FFT engine 212, which provides spur estimates at frequencies $F_{REF}$, $2F_{REF}$, etc. For clarity, the voltage/current signal output by FFT engine 212 may include frequency components at frequencies $F_{REF}$, $2F_{REF}$, etc.

In system 200, PFD 202 receives reference signal $V_{REF}$ 216 at a first input 220 and receives a feedback signal from divider 208 at a second input 222. The output signals provided by PFD 202 (e.g., UP signal 110 and DN signal 112) are provided to input 224 of charge pump 100. The output signal of charge pump 100 is provided to input 226 of loop filter 204 (which may be implemented as an analog filter and/or a digital filter). As described above in FIG. 1A, charge pump 100 provides the signal at node 114 to loop filter 204. The output signal of loop filter 204 is provided to input 228 of VCO 206. The output signal of VCO 206 is provided to input 230 of FFT engine 212 and to input 231 of divider 208. The output of reference spur correction block 210 is provided to input 228 of VCO 206. Reference spur correction block 210 also includes one or more phase shifters 232 and one or more capacitor banks 234. Phase shifters 232 and one or more capacitor banks 234 represent reference spur correction circuitry in this example. In other examples, other circuitry may be present within reference spur correction block 210 to perform reference spur correction.

In an example, PFD 202 provides the UP 110 and DN 112 signals to charge pump 100. Charge pump 100 converts these signals into an analog signal that is filtered by loop filter 204 and then provided to VCO 206. The analog signal from charge pump 100 controls the frequency of VCO 206. To lock in a frequency for the PLL, charge pump 100 holds its output voltage at a constant voltage. Loop filter 204 removes high frequency noise, influences hold and capture ranges, and influences the switching speed of the loop. Divider 208 may be a frequency divider that translates the higher frequency output of VCO 206 for comparison to the lower frequency ($F_{REF}$) of reference signal $V_{REF}$ 216.

FFT engine 212 and reference spur correction block 210 perform reference spur correction in an example. First, system 200 is placed in an open-loop configuration, which means that no feedback is used in system 200. In the open-loop configuration, the capacitor banks 234 in reference spur correction block 210 are scanned through using an algorithm, such as a digital algorithm executed by a controller or processor (not shown in FIG. 2A). For each phase produced by the phase shifters 232 (0, 90, 180, and 270 degrees), each capacitor value in the capacitor banks 234 is selected, and the FFT engine 212 estimates gain and phase mapping for each capacitor value. The FFT engine 212 therefore performs a channel estimation that determines a gain and phase mapping for each combination of phase and capacitor value. These estimates are stored and are later used to perform the reference spur correction. With these estimates, the appropriate phase and capacitor value in reference spur correction block 210 may be selected to provide a correction signal that reduces or suppresses the reference spurs.

After FFT engine 212 has performed the gain and phase mapping estimation and stored the estimates, the system 200 is placed in a closed-loop configuration, which is the normal operating mode of the PLL that includes feedback provided to PFD 202. In the closed-loop configuration, FFT engine 212 estimates the gain and phase error of the output signal for frequencies at $F_{REF}$, $2F_{REF}$, etc. This estimation provides the location and magnitude of the reference spurs in the PLL. Based on this estimation, an appropriate phase and capacitor value from reference spur correction block 210 is selected that reduces or suppresses the reference spurs. The phase and capacitor value combinations were previously estimated by FFT engine 212 and stored as described above. The selected phase and capacitor values produce a correction signal that is provided by reference spur correction block 210 to the input 228 of VCO 206. The correction signal reduces or suppresses the reference spurs.

In other examples, FFT engine 212 may be placed elsewhere in system 200. FFT engine 212 may be at an output of a receiver or an output of a transmitter in some examples. For example, FFT engine 212 may be placed at a transmitter output to determine reference spurs at the transmitter output. Then, the reference spur correction block 210 may provide a correction signal that reduces or suppresses the reference spurs that appear at the transmitter output.

In another example, a multiplexer (not shown in FIG. 2A) may select a signal from a location in the PLL to provide to FFT engine 212. For example, the multiplexer could receive signals from the input of VCO 206, a receiver output, a transmitter output, and any other location, and then the multiplexer could select which signal to provide to FFT engine 212. FFT engine 212 may then use the selected signal to determine reference spurs for reference spur correction block 210. FFT engine 212 may receive an input signal from anywhere in the PLL signal chain or another suitable location and determine reference spurs based on that input signal. The reference spur correction block 210 then produces a correction signal based on the reference spurs determined by FFT engine 212.

Figure 2B:
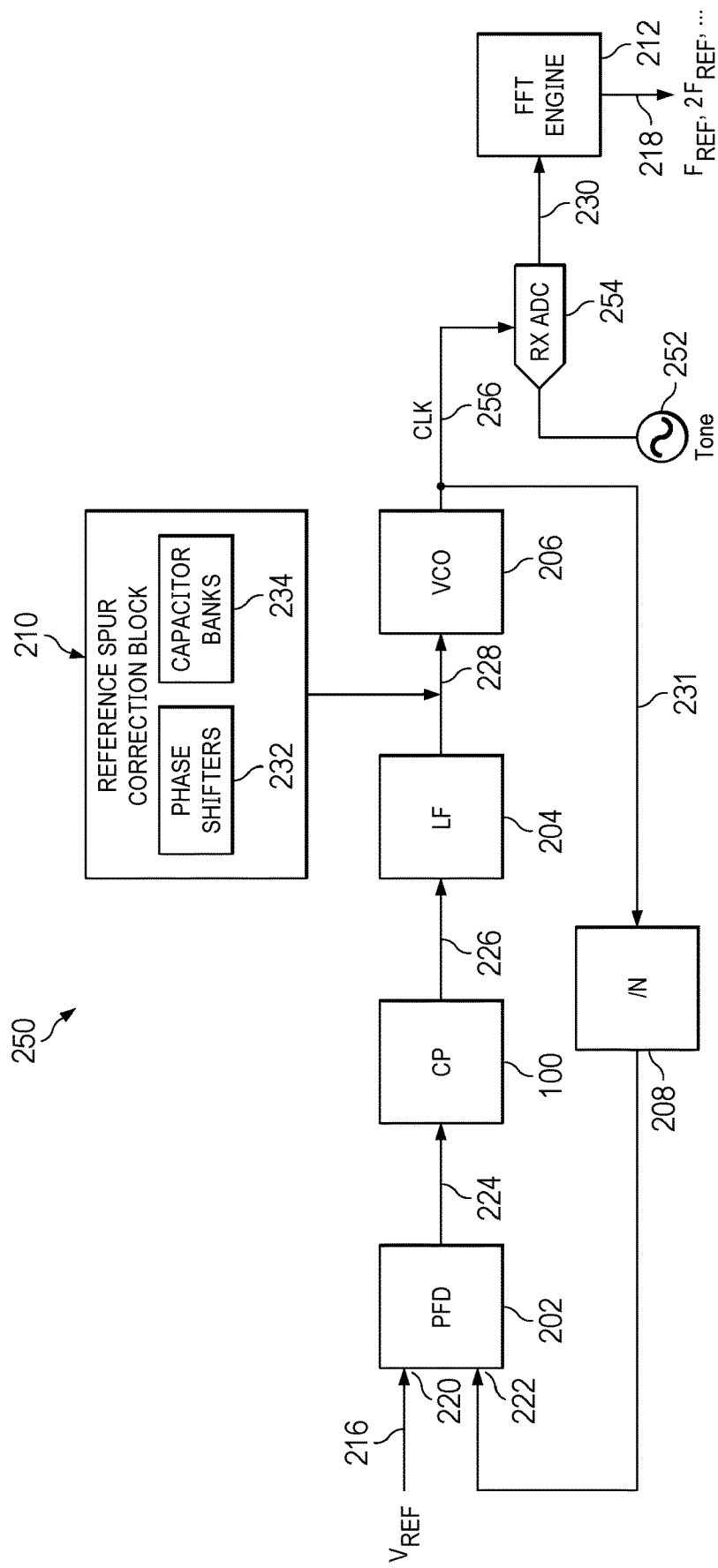
FIG. 2B is a block diagram of a system for reference spur correction in accordance with various examples.

FIG. 2B is a block diagram of a system 250 for reference spur correction in accordance with various examples herein. Many of the components of FIG. 2B are described above with respect to FIG. 2A, and like numerals denote like components. System 250 is another example of a system for reference spur correction. In system 250, a known signal is provided to a receiver (RX) or a receiver analog-to-digital converter (ADC), along with a clock (CLK) input from VCO 206. FFT engine 212 determines the reference spurs.

System 250 includes a tone signal generator 252 that produces a known signal (e.g., a signal with a known frequency). The known signal is provided to RX ADC 254, which may be an ADC in a receiver. CLK signal 256 is also provided to RX ADC 254. RX ADC 254 produces an output signal that is provided to input 230 of FFT engine 212. As described above, FFT engine 212 then determines the reference spurs.

Figure 2C:
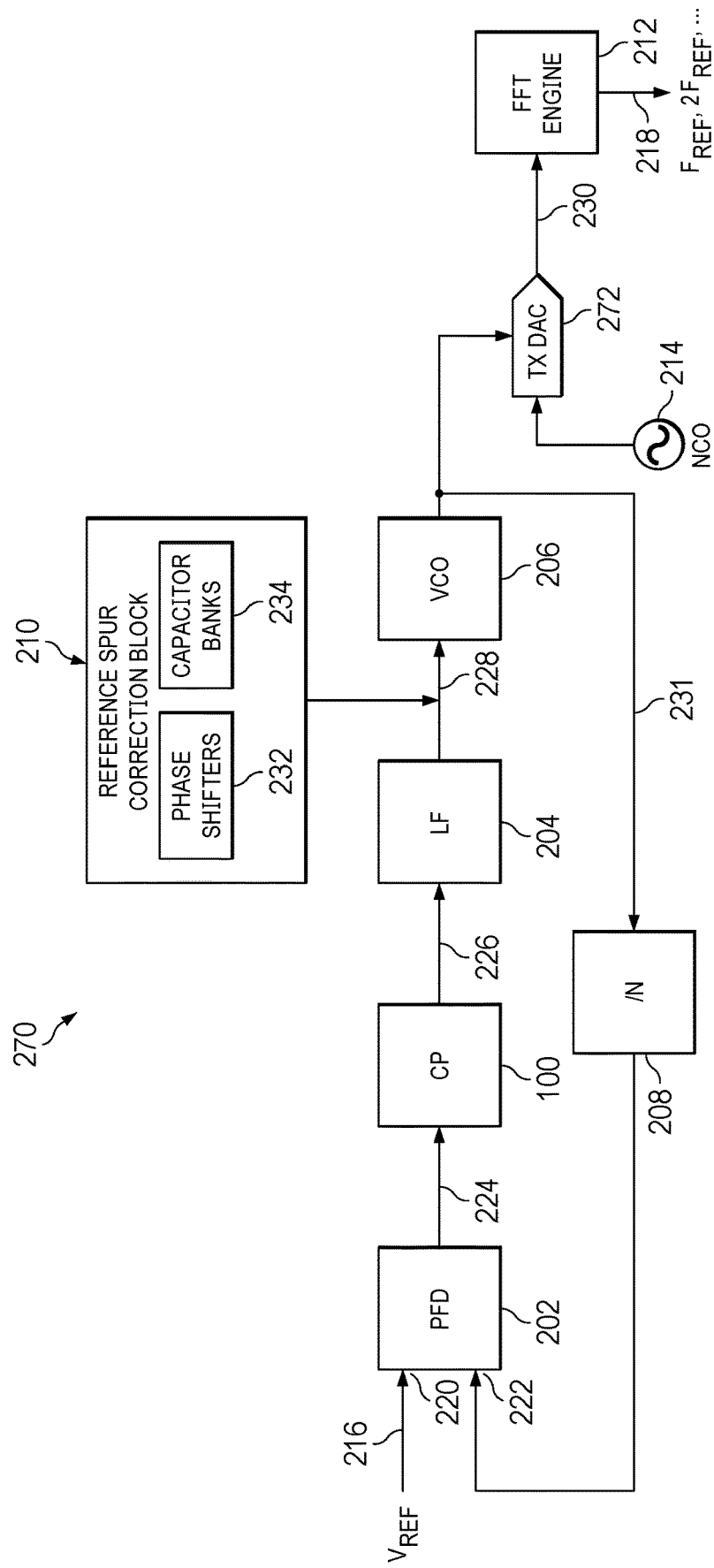
FIG. 2C is a block diagram of a system for reference spur correction in accordance with various examples.

FIG. 2C is a block diagram of a system 270 for reference spur correction in accordance with various examples herein. Many of the components of FIG. 2C are described above with respect to FIG. 2A, and like numerals denote like components. System 270 is another example of a system for reference spur correction. In system 270, an output signal from VCO 206 along with a signal from NCO 214 are provided to a transmitter (TX) digital-to-analog converter (DAC) 272. TX DAC 272 provides an output signal to input 230 of FFT engine 212. As described above, FFT engine 212 then determines the reference spurs in this output signal.

Figure 3:
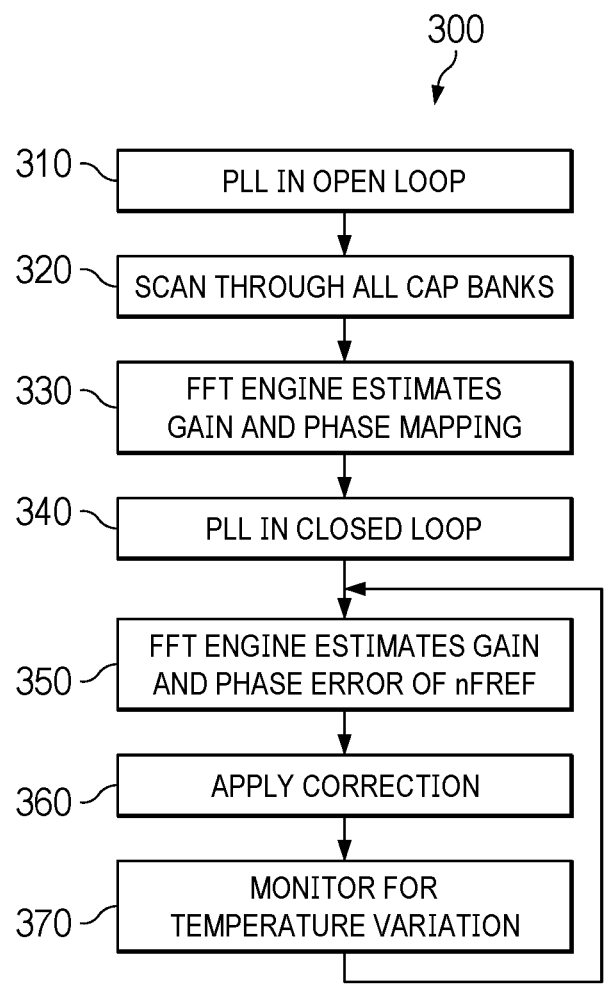
FIG. 3 is flow diagram of a method for reference spur correction in accordance with various examples.

FIG. 3 is a flow diagram of a method 300 for reference spur correction in accordance with various examples herein. The steps of method 300 may be performed in any suitable order. The hardware components described above with respect to FIGS. 1A and 2A-2C may perform method 300 in some examples.

Method 300 begins at 310, where the PLL is placed in an open-loop configuration. In the open-loop configuration, no feedback is provided in the PLL. As an example, divider 208 does not provide feedback to PFD 202 in the open-loop configuration.

Method 300 continues at 320, where the capacitor banks 234 in reference spur correction block 210 are scanned using an algorithm to select each capacitor value. Any suitable processor, controller, analog and/or digital hardware may be useful for selecting each capacitor value. As an example, a digital controller may use switches to select each capacitor value for each phase provided by the phase shifters 232.

Method 300 continues at 330, where the FFT engine 212 estimates the signal response (e.g., gain and phase mapping) for the signals provided by each combination of phase and capacitor value scanned at 320 described above. FFT engine 212 performs these estimates and stores the results in memory so the appropriate results may be retrieved later and used to correct a reference spur.

Method 300 continues at 340, where the PLL is placed in a closed-loop configuration. Closed-loop is the normal operating mode of the PLL that includes feedback provided to PFD 202.

Method 300 continues at 350, where FFT engine 212 estimates the gain and the phase error of the $nV_{REF}$ signals (the multitude, n, of reference signals), such as for frequencies at or around $F_{REF}$, $2F_{REF}$, $3F_{REF}$, etc. These estimates provide information regarding the reference spurs in the PLL, such as the magnitude and frequency of the spurs.

Method 300 continues at 360, where the correction signal is applied to the PLL. The correction signal is selected via a controller, processor, and/or other circuitry. The correction signal includes a selected phase value provided by phase shifter 232 and a selected magnitude provided by capacitor banks 234. The correction signal is selected based on the estimates of the reference spurs provided by FFT engine 212 at 350. An appropriate correction signal is selected that reduces or suppresses the reference spurs. In some examples, as described below, a combination of phase shifter 232 and capacitor values from capacitor banks 234 may be selected to more closely approximate the reference spurs and provide a more accurate correction signal.

Method 300 continues at 370, where the PLL is continuously monitored for temperature or other variations. Correction signals may be applied based on this continuous monitoring. FFT engine 212 may continuously estimate gain and phase error of $nF_{REF}$ signals and provide that information to a controller or other control circuitry so reference spur correction block 210 may produce an appropriate correction signal.

Figure 4:
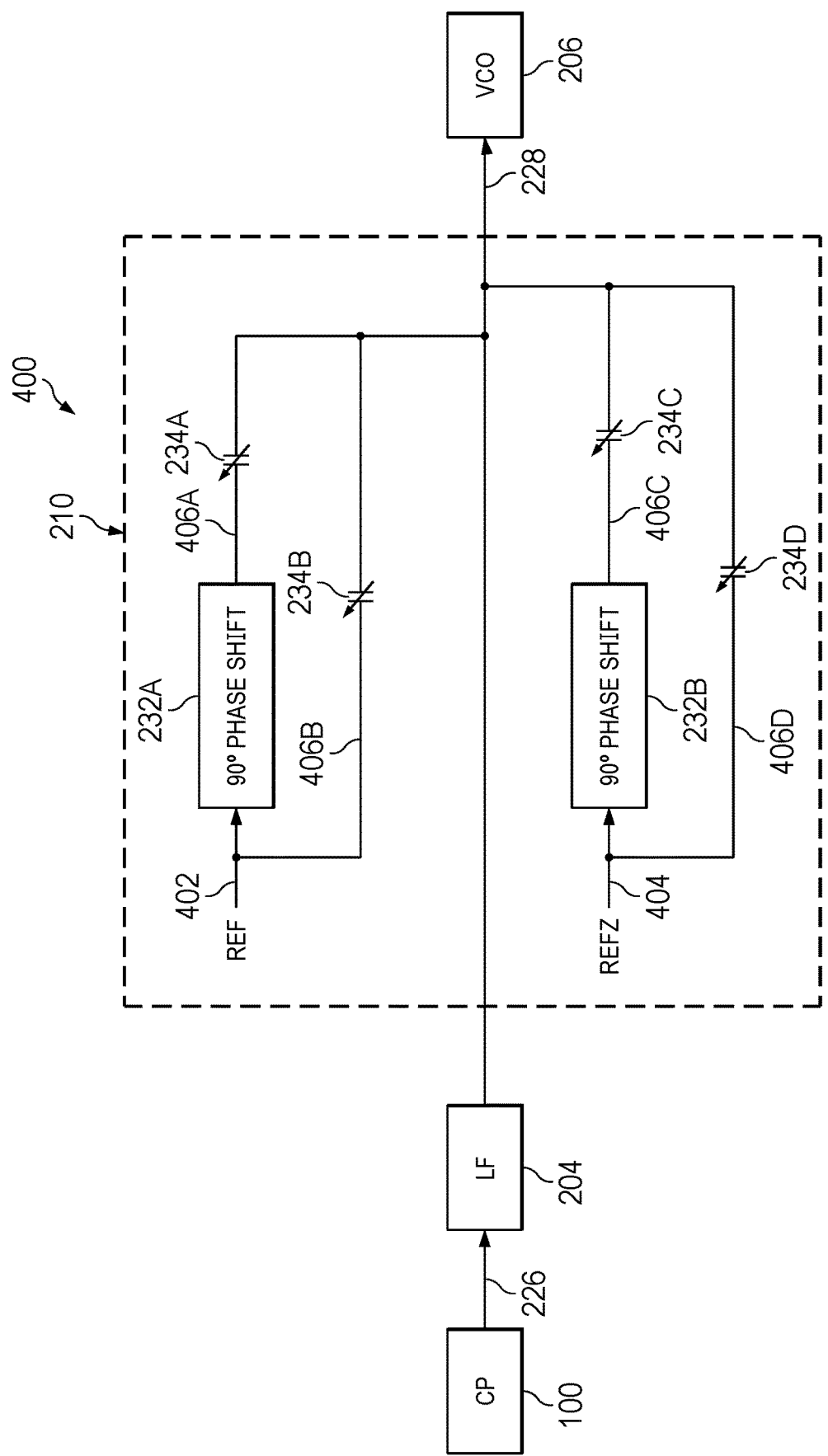
FIG. 4 is a block diagram of a system for reference spur correction in accordance with various examples.

FIG. 4 is a block diagram of a system 400 for reference spur correction in accordance with various examples herein. Some of the components in system 400 are described above, and like numerals denote like components. System 400 includes charge pump 100, loop filter 204, VCO 206, and reference spur correction block 210. System 400 shows one example of the internal components of reference spur correction block 210. In this example, reference spur correction block 210 includes two phase shifters, 232A and 232B. Phase shifters 232A and 232B may include programmable delay elements to provide specific phase shifts in some examples. Reference spur correction block 210 also includes variable capacitors 234A, 234B, 234C, and 234D (collectively, capacitor banks 234). The capacitor banks 234 may be implemented as variable capacitors as shown here or as any other suitable circuitry, such as capacitor banks selectable by switches, etc. System 400 also includes a reference clock signal REF 402 and its inverse REFZ 404. These reference clock signals are phase shifted and provided to the capacitor banks 234 to produce the correction signal within reference spur correction block 210. System 400 also includes paths 406A, 406B, 406C, and 406D (collectively, paths 406).

To produce a correction signal, circuitry in reference spur correction block 210 creates a signal with a specific phase (as selected by phase shifters 232) and a specific magnitude (as selected by capacitor banks 234). The created signal is the correction signal that is provided to reduce or suppress the reference spurs. First, FFT engine 212 estimates gain and phase error of $nV_{REF}$ signals and provides that information to a controller or other control circuitry. Then, the controller or other control circuitry selects the appropriate phase and magnitude in reference spur correction block 210 to create a correction signal that reduces or suppresses the reference spurs. Finally, the correction signal is applied to the input 228 of VCO 206.

As an example, the REF signal 402 has a 0° phase shift. Therefore, REF signal 402 along path 406B also has a 0° phase shift. REF signal 402 is provided to phase shifter 232A. In this example, phase shifter 232A provides a 90° phase shift to REF signal 402. The signal provided by phase shifter 232A along path 406A has a 90° phase shift. Similarly, REFZ signal 404 is the inverse of REF signal 402, such that REFZ signal 404 has a 180° phase shift, which is provided along path 406D. Phase shifter 232B provides a 90° phase shift to REFZ signal 404. The signal provided by phase shifter 232B along path 406C has a 270° phase shift. Therefore, by selecting one of the four paths 406, a correction signal with 0°, 90°, 180°, or 270° phase may be created. If the controller or algorithm for determining the correction signal determines that the correction signal should have a different phase, a combination of signals along the paths 406 may be selected and provided to VCO 206. For example, if the correction signal should have a 45° phase, half of the correction signal could be provided by the 0° path and half by the 90° path. Reference spur correction block 210 may use any combination of the paths to provide the appropriate phase for the correction signal.

Capacitor banks 234 provide the magnitude or gain of the correction signal. Similar to the phase of the correction signal, FFT engine 212 determines the magnitude of the reference spurs during PLL operation. The appropriate capacitor values are selected via capacitor banks 234 to provide the proper magnitude for the correction signal. As described above, FFT engine 212 has previously scanned through all capacitor values and determined the gain and phase mapping provided by each combination of phase and capacitor value. With this stored information, a controller can select the phase and gain within reference spur correction block 210 that reduces or suppresses the reference spurs. The magnitude or gain may be selected by choosing a capacitor value via capacitor banks 234 along the appropriate path 406. For example, if the correction spur has a 180° phase shift, the correction signal will be provided by path 406D. Capacitor bank 234D on path 406D is adjusted to provide the capacitor value that produces the proper magnitude for the correction signal. The capacitor values may be selected from the capacitor banks 234 using switches or any other suitable circuitry. The proper capacitor value is selected based on the estimation of gain and phase mapping performed by FFT engine 212 as described at 330 of method 300 above.

System 400 has two phase shifters 232 and four capacitor banks 234 in one example. In other examples, reference spur correction block may have a different number of phase shifters 232 and/or a different number of capacitor banks 234. In other examples, the phase of the correction signal may be selected using different analog or digital circuitry, and the magnitude of the correction signal may be selected using circuitry other than capacitor banks 234.

Figure 5:
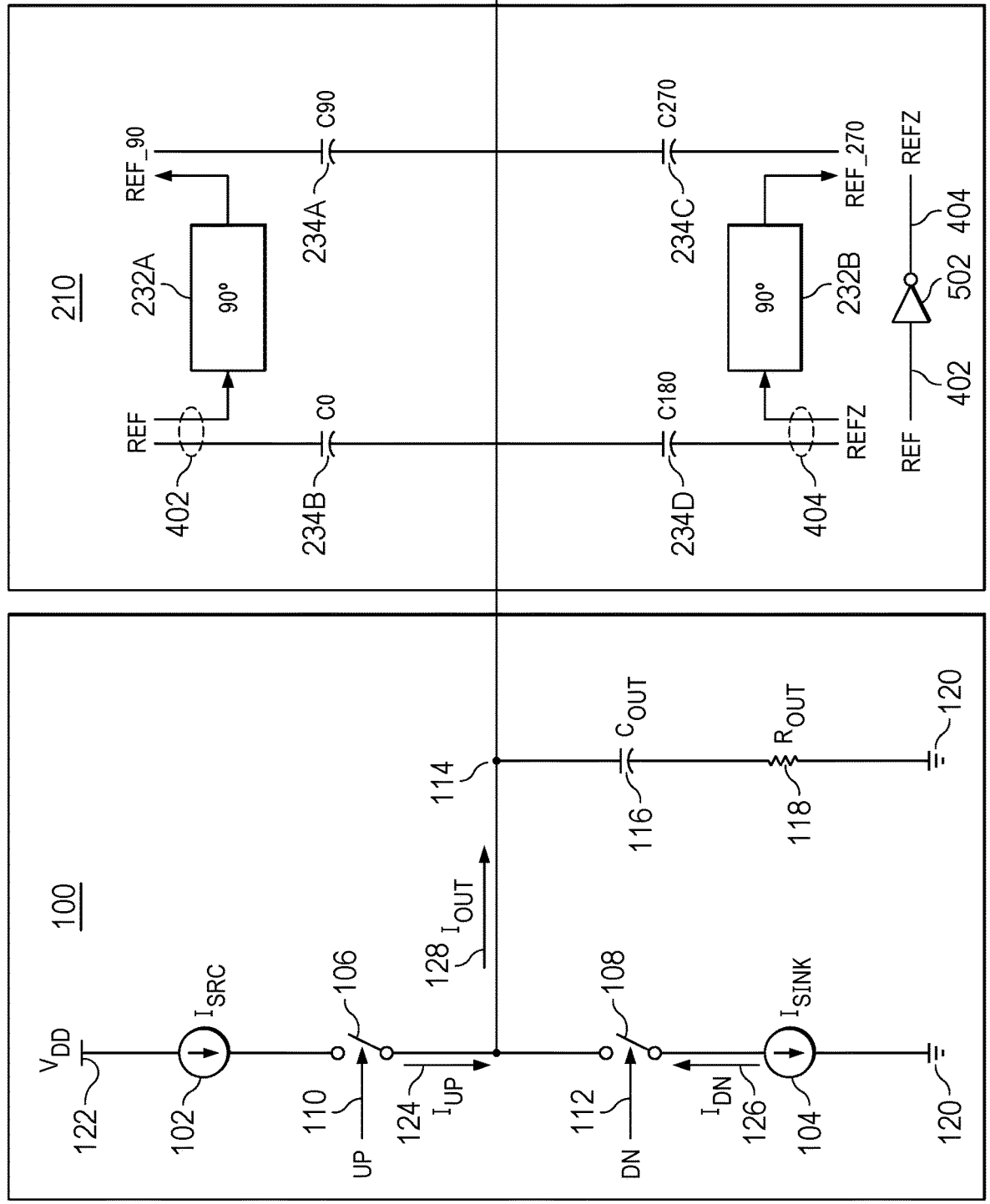
FIG. 5 is a schematic diagram of a system for reference spur correction in accordance with various examples.

FIG. 5 is a schematic diagram of a system 500 for reference spur correction in accordance with various examples herein. Some of the components in system 400 are described above, and like numerals denote like components. System 500 shows charge pump 100 coupled to reference spur correction block 210, which is coupled to VCO 206. System 500 includes an inverter 502 that receives REF signal 402 and inverts the signal to produce REFZ signal 404.

The components and the operation of charge pump 100 are described above with respect to FIG. 1. The components and the operation of reference spur correction block 210 are described above with respect to FIG. 4. System 500 includes one example of circuitry for charge pump 100, but other circuitry may be useful in other examples. System 500 includes one example of circuitry for reference spur correction block 210. In other examples, reference spur correction block 210 may include other circuitry to produce correction signals.

Figure 6:
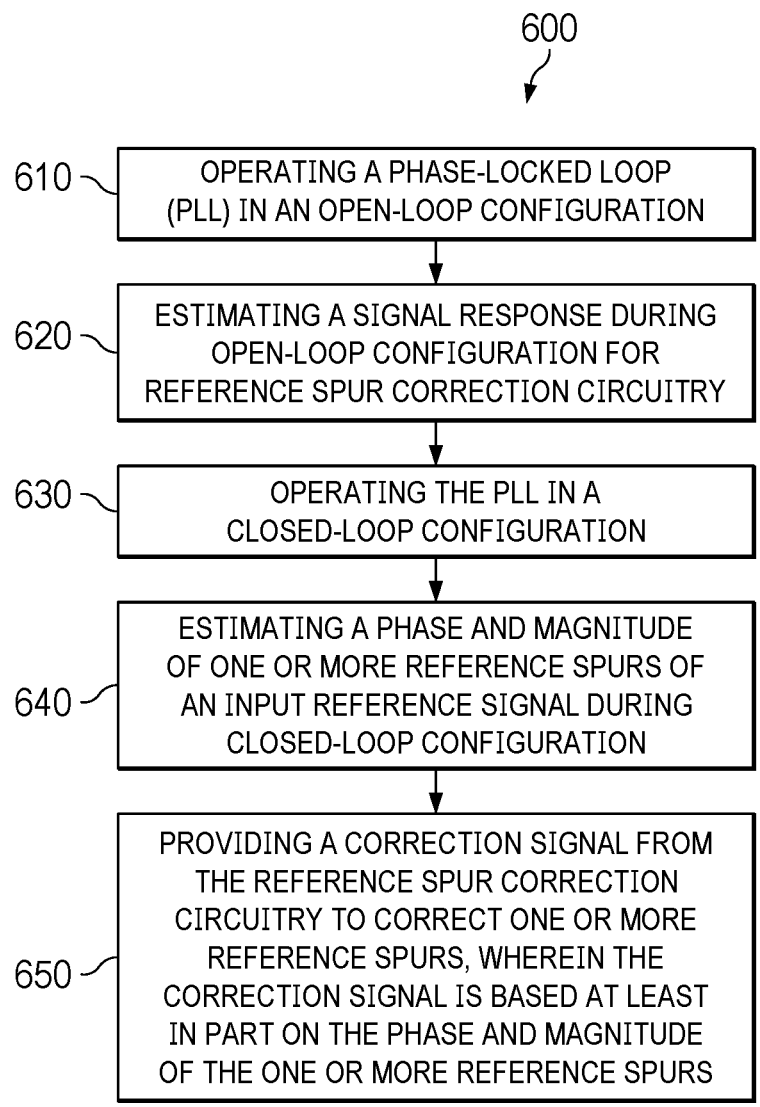
FIG. 6 is a flow diagram of a method for reference spur correction in accordance with various examples.

FIG. 6 is a flow diagram of a method 600 for reference spur correction in accordance with various examples herein. The steps of method 600 may be performed in any suitable order. The hardware components described above with respect to FIGS. 1-2 and 4-5 may perform method 600 in some examples.

Method 600 begins at 610, where a PLL is operated in an open-loop configuration. As described above, in the open-loop configuration, no feedback is provided in the PLL. As an example, divider 208 does not provide feedback to PFD 202 in the open-loop configuration.

Method 600 continues at 620, where circuitry such as an FFT engine estimates a signal response during open-loop configuration for reference spur correction circuitry. In other examples, a controller or processor may perform the estimation for the signal response as described herein.

Method 600 continues at 630, where the PLL is operated in a closed-loop configuration. Closed-loop is the normal operating mode of the PLL that includes feedback provided to PFD 202.

Method 600 continues at 640, where circuitry such as an FFT engine estimates a phase and magnitude of one or more reference spurs of an input reference signal during closed-loop configuration. In other examples, a controller or processor may perform the estimation for the signal response as described herein.

Method 600 continues at 650, where reference spur correction circuitry provides a correction signal to correct one or more reference spurs. The correction signal is based at least in part on the phase and magnitude of the one or more reference spurs. The correction signal has a phase and magnitude that reduces or suppresses the one or more reference spurs when the correction signal is added to the signal chain.

In examples herein, a low-power cancellation scheme is provided that may performed entirely within a chip in some examples. The circuitry that provides the correction signal produces no degradation of phase margin and gain margin because additional filters are not added to the PLL. The examples described herein include low additional area to implement. The examples herein do not introduce additional noise which may occur with other reference spur cancellation schemes.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A system, comprising:
   a phase frequency detector (PFD);
   a charge pump coupled to the PFD;
   a loop filter coupled to the charge pump;
   a voltage controlled oscillator (VCO) directly coupled to the loop filter;
   a fast Fourier transform (FFT) engine coupled to an output of the VCO, the FFT engine configured to estimate a phase and a magnitude of reference spurs of an input reference signal; and
   spur correction circuitry directly coupled to an input of the VCO, the spur correction circuitry configured to correct for the reference spurs of the input reference signal based at least in part on the phase and magnitude of the reference spurs.

2. The system of claim 1, wherein the spur correction circuitry includes:
   a phase shifter configured to phase shift a reference clock.

3. The system of claim 2, wherein the phase shifter includes a programmable delay element.

4. The system of claim 1, wherein the spur correction circuitry includes:
   one or more variable capacitors coupled to the input of the VCO.

5. The system of claim 4, wherein the FFT engine is further configured to:
   estimate a gain and phase response of the one or more variable capacitors.

6. The system of claim 5, wherein the FFT engine is configured to estimate the gain and phase response of the one or more variable capacitors in an open-loop configuration.

7. The system of claim 1, further comprising:
   a frequency divider coupled to the VCO and to the phase/frequency detector.

8. A method, comprising:
   operating a phase-locked loop (PLL) in an open-loop configuration;
   estimating a signal response during open-loop configuration for reference spur correction circuitry;
   operating the PLL in a closed-loop configuration;
   operating a voltage controlled oscillator (VCO), the VCO directly coupled to a loop filter and the reference spur correction circuitry;
   estimating a phase and magnitude of one or more reference spurs of an input reference signal during closed-loop configuration; and
   providing a correction signal from the reference spur correction circuitry to correct one or more reference spurs, wherein the correction signal is based at least in part on the phase and magnitude of the one or more reference spurs.

9. The method of claim 8, further comprising a fast Fourier transform (FFT) engine estimating the signal response for the reference spur correction circuitry and estimating the phase and magnitude of the one or more reference spurs.

10. The method of claim 8, further comprising the correction signal including a phase and magnitude that suppresses at least one of the one or more reference spurs.

11. The method of claim 8, further comprising providing the correction signal to an input of a voltage controlled oscillator in the PLL.

12. The method of claim 8, further comprising the reference spur correction circuitry including one or more phase shifters configured to select a phase of the correction signal.

13. The method of claim 8, further comprising the reference spur correction circuitry including one or more variable capacitors configured to select a magnitude of the correction signal.

14. The method of claim 8, further comprising estimating the phase and magnitude of one or more reference spurs of the input reference signal at a transmitter output.

15. The method of claim 8, further comprising estimating the phase and magnitude of one or more reference spurs of the input reference signal at a receiver output.

16. A system, comprising:
   a phase-locked loop (PLL), the PLL including:
      a phase frequency detector (PFD) coupled to a charge pump, the PFD configured to receive an input reference signal;
      a loop filter coupled to the charge pump; and
      a voltage controlled oscillator (VCO) directly coupled to the loop filter;
   a spur correction circuitry directly coupled to an input of the VCO; and
   a fast Fourier transform (FFT) engine configured to:
      estimate a phase and a magnitude of reference spurs of the input reference signal; and
      estimate a signal response for reference the spur correction circuitry,
   wherein the reference spur correction circuitry is configured to provide a correction signal to correct for the reference spurs of the input reference signal based at least in part on the phase and magnitude of the reference spurs and the signal response of the reference spur correction circuitry.

17. The system of claim 16, wherein the reference spur correction circuitry includes one or more phase shifters configured to select a phase of the correction signal.

18. The system of claim 16, wherein the reference spur correction circuitry includes one or more variable capacitors configured to select a magnitude of the correction signal.

19. The system of claim 16, wherein the FFT engine is coupled to an output of the VCO.

20. The system of claim 16, wherein the reference spur correction circuitry is coupled to an input of the VCO.

21. The system of claim 1, further comprising:
   a frequency divider coupled to the VCO and to the phase/frequency detector.

* * * * *